United States Patent
Weber et al.

(10) Patent No.: US 6,171,454 B1
(45) Date of Patent: Jan. 9, 2001

(54) METHOD FOR COATING SURFACES USING A FACILITY HAVING SPUTTER ELECTRODES

(75) Inventors: Thomas Weber, Korntal-Muenchingen; Johannes Voigt, Leonberg; Susanne Lucas, Stuttgart, all of (DE)

(73) Assignee: Robert Bosch GmbH, Stuttgart (DE)

(*) Notice: Under 35 U.S.C. 154(b), the term of this patent shall be extended for 0 days.

(21) Appl. No.: 09/308,476

(22) PCT Filed: Sep. 15, 1998

(86) PCT No.: PCT/DE98/02726

§ 371 Date: Sep. 16, 1999

§ 102(e) Date: Sep. 16, 1999

(87) PCT Pub. No.: WO99/14390

PCT Pub. Date: Mar. 25, 1999

(30) Foreign Application Priority Data

Sep. 17, 1997 (DE) .............................................. 197 40 793

(51) Int. Cl.[7] .......................... C23C 14/34; C23C 14/36; C23C 14/00

(52) U.S. Cl. .............................. 204/192.12; 204/192.15; 204/192.16; 204/192.22; 204/192.23; 204/298.02; 204/298.06; 204/298.07; 204/298.08; 204/298.23; 204/298.26; 118/723 R; 118/723 VE; 118/723 MP; 118/723 E; 427/569; 427/575; 427/576; 427/577; 427/578; 427/580; 427/585

(58) Field of Search ........................ 204/192.12, 192.15, 204/192.16, 192.22, 192.23, 298.02, 298.06, 298.07, 298.08, 298.23, 298.26; 118/723 R, 723 VE, 723 MP, 723 E; 427/569, 575, 576, 577, 578, 580, 585

(56) References Cited

U.S. PATENT DOCUMENTS

| 3,860,507 | 1/1975 | Vossen, Jr. . |
|---|---|---|
| 5,169,509 | 12/1992 | Latz et al. . |
| 5,303,139 | * 4/1994 | Mark ................................ 204/298.08 |
| 5,651,865 | * 7/1997 | Sellers .............................. 204/192.13 |
| 5,725,913 | * 3/1998 | Wong et al. ......................... 427/350 |
| 5,942,089 | * 8/1999 | Sproul et al. .................... 204/192.13 |

FOREIGN PATENT DOCUMENTS

| 252 205 | 6/1910 | (DE) . |
| 43 43 042 | 3/1995 | (DE) . |
| 4343042 C1 | * 3/1995 | (DE) . |

(List continued on next page.)

OTHER PUBLICATIONS

Frach et al., "The double ring magnetron process module—a tool for stationary deposition of metals, insulators and reactive sputtered compounds," Surface Coatings & Technology, 90, pp. 75–81, Mar. 1997.*

**Frach P. et al., "The double ring magnetron process module—a tool for stationary deposition of metals, insulators and reactive sputtered compounds," Surface and Coatings Technology, Mar. 15, 1997, Elsevier, Switzerland, vol. 90, No. 1–2, pp. 75–81.

(List continued on next page.)

Primary Examiner—Alan Diamond
(74) Attorney, Agent, or Firm—Kenyon & Kenyon

(57) ABSTRACT

Described is a method for coating surfaces using a facility having sputtering electrodes, which has at least two electrodes that are spaced apart from one another and arranged inside a process chamber, and an inlet for a process gas. The two sputtering electrodes are acted upon by a bipolarly pulsed voltage in such a way that they are alternately operated as cathodes and as anodes. In addition, the frequency of the voltage is set between 1 kHz and 1 MHz. Furthermore, and that the operating parameters are selected in such a way that in operation, the electrodes are at least partially covered by a coating material.

46 Claims, 2 Drawing Sheets

FOREIGN PATENT DOCUMENTS

| | | |
|---|---|---|
| 195 06 515 | 3/1996 | (DE) . |
| 195 37 263 | 4/1997 | (DE) . |
| 583 736 | 2/1994 | (EP) . |
| 736 612 | 10/1996 | (EP) . |

OTHER PUBLICATIONS

**Scholl R. A., "Asymmetric Bipolar Pulsed Power. A New Power Technology," Le Vide: Science, Technique et Applications, vol. 52, No. 280, Apr. 1, 1996, pp. 237–243.

**Kusaka, K., et al., "Effect of Nitrogen Gas Pressure on Residual Stress in Ain Films Deposited by the Planar Magnetron Sputtering System," Thin Solid Films, vol. 281/282, No. 1/02, Aug. 1, 1996, pp. 340–343.

**Yoshio Manabe et al., "Zinc Oxide Thin Films Prepared by the Electron–Cyclotron–Resonance Plasma Sputtering Method," Japanese Journal of Applied Physics, vol. 29, No. 2, Part 01, Feb. 1, 1990, pp. 334–339.

**Shew B–Y et al., "Effects of r.f. bias and nitrogen flow rates on the reactive sputtering of TiAlN films," Thin Solid Films, vol. 293, No. 1–2, Jan. 30, 1997, pp. 212–219.

**Smith, P. H., "Method of Varying Composition of Multi Component. Sputtered Films, Nov. 1981," IBM Technical Disclosure Bulletin, vol. 24, No. 6, Nov. 1981, pp. 2962–2963.

Patent Abstracts of Japan, abstract for JP 56–55,564, May, 1981.

* cited by examiner-

METHOD FOR COATING SURFACES USING A FACILITY HAVING SPUTTER ELECTRODES

FIELD OF THE INVENTION

The present invention relates to a method for coating surfaces using a facility which has at least two electrodes that are spaced apart from one another and arranged inside a process chamber, and which has an inlet for a process gas.

BACKGROUND INFORMATION

German Patent No. 252 205 discloses an atomization device which is suitable for manufacturing thin films by vacuum coating. In particular, it is possible with this device to deposit dielectric films. The atomization device comprises at least two electrodes and magnet systems, the electrodes being electrically connected in such a way that they alternatingly constitute an anode and a cathode. A sine-wave alternating voltage of 50 Hz has proven particularly advantageous. In this device, material ablation occurs from the electrodes in such a way that all the electrodes are ablated uniformly as a result of the alternating voltage.

So-called magnetron sputtering facilities are known to those skilled in the art. They are used, for example, to deposit wear-resistant, metal-containing carbon films. In these, a carbon-containing gas is admitted into a process space or process chamber of the facility, reacted appropriately in the sputtering process on the metal cathode surface being acted upon by a DC voltage, and deposited as a film, together with metal atoms and hydrogen, on the substrates present in the process chamber. The coating plasma which is constituted in the process chamber as a result of the process is located substantially in front of the sputtering cathodes. Because of the large-area cathodes, the coating is highly uniform but also directed. In addition, the coating rate and thus the cost-effectiveness of the method cannot be increased arbitrarily. The coating rate can be increased by adding more of the carbon-containing gas, but this results in the undesirable effect that the surface of the cathodes is increasingly coated in planar fashion with an insulating carbon-containing film. When the surfaces of the cathodes are completely covered, stable DC sputtering operation is no longer possible.

U.S. Pat. No. 3,860,507 discloses a coating method in which two cathodes (targets) located diametrically opposite one another are operated at high frequency (preferably 13.56 MHz), so that a discharge plasma forms between the targets. The targets are connected to two outputs of a secondary coil of an alternating voltage power supply, from which a center tap leads to the wall of the process chamber.

U.S. Pat. No. 5,169,509 furthermore discloses a method in which a reactive coating with electrically insulating films is guaranteed by the fact that two magnetron cathodes are operated with an alternating voltage, while a reactive gas is introduced into the process chamber.

SUMMARY OF THE INVENTION

The method for coating surfaces has, in contrast, the advantages that a high coating rate, stable operation, and a reduction in discharges (microarcs) on the electrode surfaces can be achieved. The method represents a combination of a sputtering method and a plasma-assisted CVD method. This can be achieved by the fact that, for example, two commercially available sputtering cathodes are acted upon by a bipolarly pulsed voltage in such a way that they are alternately operated as cathodes and as anodes, the frequency of this voltage lying in the range from 1 kHz to 1 MHz. The electrodes are arranged, for example, one opposite the other, while the substrates to be coated are located between the electrodes. Also admitted, in addition to the sputtering inert gas, is a reactive process gas which, in known fashion, can partially deposit on the electrode surfaces (electrode poisoning). The use according to the present invention of a bipolarly pulsed voltage guarantees two results:

The first result is that the process can proceed in stable fashion even if the electrodes are partially or completely covered with an electrically insulating film. Consider the case in which one of the electrodes is connected at a given moment to a negative voltage, and is thus being operated as the cathode. In this case, electrode material is being ablated by ion bombardment in accordance with the process, but electrically insulating regions of the surface of the electrode material are also being electrically charged until the ion bombardment drops to zero in those regions due to the charging and the electrostatic repulsion associated therewith. Ablation performance and thus the coating rate are therefore reduced. If the electrically conductive (uncovered) portion of the cathodically connected electrode surface is too small or zero, the plasma will also extinguish and the process will end; stable sputtering operation is no longer possible. According to the present invention, however, the result of reversing the polarity of the applied electrode voltages is that the said electrode acts in a subsequent time period as the anode, and thus an electron current is drawn onto the surface, first electrically discharging the electrically insulating surface regions that have been positively charged by previous ion bombardment, and then negatively charging them. It is possible in this fashion, by appropriately selecting the frequency of the applied bipolar electrode voltage, to achieve stable operation of the electrodes and prevent the plasma from extinguishing.

It is thus possible, as compared with conventional methods, to work with electrodes that are more heavily or indeed completely covered. This means that higher gas flow rates are possible, reaction of the gas on the electrode surfaces can take place to a greater extent, and the coating rate can thus be increased.

Secondly, the use of a pulsed electrode voltage almost completely prevents the formation of so-called microarcs: charging of electrically insulating regions of the cathodically connected electrode surfaces can ultimately cause a voltage discharge to an adjacent conductive region. This discharge on the electrode surfaces, called a "microarc," is known to interfere with stable operation, and can result in a change in the electrode surface and in the incorporation of foreign particles into the film being deposited onto the substrates. The use of a bipolarly pulsed voltage greatly reduces the probability of microarcing.

As a further and critical advantage, according to the present invention a plasma-assisted CVD film deposition occurs from the plasma moving between the electrodes, in addition to the film deposition by conversion of the reactive gas on the electrode surfaces. This allows a considerable increase in the coating rate, and the creation of new kinds of films.

To achieve this, the parameters of the facility are selected so that the plasmas in front of the respective electrodes are not continually created and extinguished along with the pulsed electrode voltage, but rather that the plasma in front of the electrode that has just been deactivated is pulled to the electrode that is going into operation. A non-extinguishing plasma thus migrates back and forth between the electrodes, which for example are located opposite one another or are in very close proximity, at the defined pulse frequency. The substrates present in this plasma thus also experience, in addition to directed coating by the electrodes, an additional coating from the moving plasma volume, i.e. from the gas phase.

In an advantageous embodiment of the present invention, the duty cycle of the voltage, i.e. the time ratio between the positive and negative voltage values, is set at a value of 1:1. Other duty cycles are also possible.

It has proven advantageous to provide a spacing of 60 cm between two electrodes. Preferably it is also possible to select the spacing between the electrodes at up to 2 m, in particular up to approximately 1 m.

A pressure of 1 to $5 \times 10^{-3}$ mbar is preferably established inside the process chamber, acetylene and argon being used as the process gas, preferably at a ratio of from 1:1 to 10:1.

It is preferably also possible to use other gases instead of acetylene, for example methane for carbon-containing coatings; silanes, for example silane, for silicon-containing coatings; or silicon organics such as HMDS, HMDS(O), HMDS(N), TMS, (hexamethyldisilane, hexamethyldisiloxane, hexamethyldisilazane and tetramethylsilane, respectively) or organometallics, for metal-containing film systems. In addition, further gases of any kind known to those skilled in the art are usable, for example inert gases Ar, Kr, He, or other reactive gases such as $O_2$, $N_2$, $NH_3$, or $H_2$. It is of course also possible to use mixtures of the various gases described above. In an advantageous development of the present invention, the average sputtering outputs of the individual electrodes are controlled separately from one another. Alternatively, different duty cycles can be utilized. It is thereby possible to take into account different coverages or wear levels for the individual electrodes, and thus to improve process reliability. It is moreover possible to deposit multilayers with differing stoichiometry, for example $CrN/Cr_2N$ or iC(MeC)/(a-C:H), where Me=W, Ti, Cr, Ta, etc. It is furthermore possible to deposit films and film systems with continuously or discontinuously varying composition. For example, by increasing the reactive gas flow rate it is possible to vary the film composition, for example from Me—C to carbon layers with much less metal and ultimately no metal at all.

A further advantage of using a bipolar, preferably square-wave sputtering voltage is the fact that the spacing between the two electrodes can be increased, so that coating can occur over a greater volume. An appropriate pulse frequency is to be defined depending on the spacing.

In an advantageous development of the present invention, coating is performed at a temperature of less than 200° C.

In a further advantageous embodiment of the present invention, the electrodes are arranged so that they enclose an angle of 0° to 180°, preferably of 60° or 180°.

In a further advantageous embodiment, commercially available magnetron sputtering cathodes, i.e. cathodes equipped with a magnet system, are used as the electrodes. The geometry of the electrodes can be planar or curved or cylindrical.

In a further advantageous embodiment, hollow cathodes are used as the electrodes; those which exhibit either point-like, or linear, or planar radiation characteristics can be used.

In a further advantageous development, ECR electrodes which are electrically insulated with respect to the chamber wall and can be acted upon by an electrical voltage are used. The plasma at the ECR electrodes is additionally excited with microwave radiation.

In a further advantageous embodiment, medium-frequency or high-frequency electrodes electrically insulated with respect to the chamber wall, which are operated with an alternating electrical voltage with reference to ground potential and allow one plasma to burn per electrode, are used. In addition, a further alternating voltage is applied between the electrodes, moving the plasma between the electrodes and filling up the space between the electrodes.

The electrodes can be configured both as magnetic field-free diodes and as magnetron electrodes. The magnetic field can be of both balanced and unbalanced configuration. Unbalanced magnetic fields at the electrodes can be generated both by a corresponding configuration of permanent magnets and by electromagnetic coils which are positioned around or near the electrodes. In an advantageous embodiment, unbalanced operation allows an increase in the plasma density and a greater expansion in the volume of the individual electrode plasmas.

In a further advantageous embodiment of the present invention, the process chamber is connected to ground potential.

The method according to the present invention can be used with particular advantage in a batch facility, in a continuous-flow facility, or in a bulk material facility. The parts to be coated can rest immovably in front of the coating sources or can move, for example can moved past the sources or can rotate.

The gases can be fed in in the form of a gas mixture, or separately, or in different mixtures at different points in the coating facility. It may be advantageous for the inert gases such as, for example, argon to be introduced into the coating chamber close to the electrodes, and the reactive gases, such as carbon- or silicon-based gases, close to the substrate, in order to influence the deposition rate and film quality.

The method allows the electrodes to be combined with further plasma sources and coating sources such as, for example, additional sputtering sources, arc sources, hollow-cathode sources, microwave sources, RF sources, or anodically connected electrode surfaces. It is thereby possible to vary the plasma conditions, for example electron density, excitation level, or electron temperature, to influence the spatial extension, and to influence deposition rates and film properties. For example, the ion bombardment strength, ion energy, and the type of particles to be deposited can be influenced. Further elements can be introduced into the process and thus into the film by way of additional coating sources. This makes possible, for example, compositional changes or doping. As a further advantage, it is possible to influence and increase the deposition rate.

It is furthermore advantageous to influence the ion bombardment of the substrates during deposition, and to introduce energy in controlled fashion into the growth process. Film properties such as hardness, elasticity, or composition can thereby be controlled. This is achieved by applying a bias voltage to the substrate. In the case of electrically conductive films, this can be done by applying a DC voltage, alternating voltage, or bipolarly pulsed voltage. For electrically insulating films, an alternating voltage is advantageous, for example a medium- or high-frequency voltage or a pulsed bipolar voltage.

It is furthermore advantageous to select the magnitude and frequency of the bias voltage in such a way that application of the bias assistance increases the growth rate of the films. The increase in growth rates is observed in particular for carbon- and silicon-based films.

It is furthermore advantageous, when an alternating frequency bias or pulsed bias is used, to adjust the timing frequency and phase of the bias and the electrode power supplies to one another. This influences the growth rates, morphology, and hardness of the films, as well as the temperature of the substrates during the coating process.

DETAILED DESCRIPTION

Figure 1:
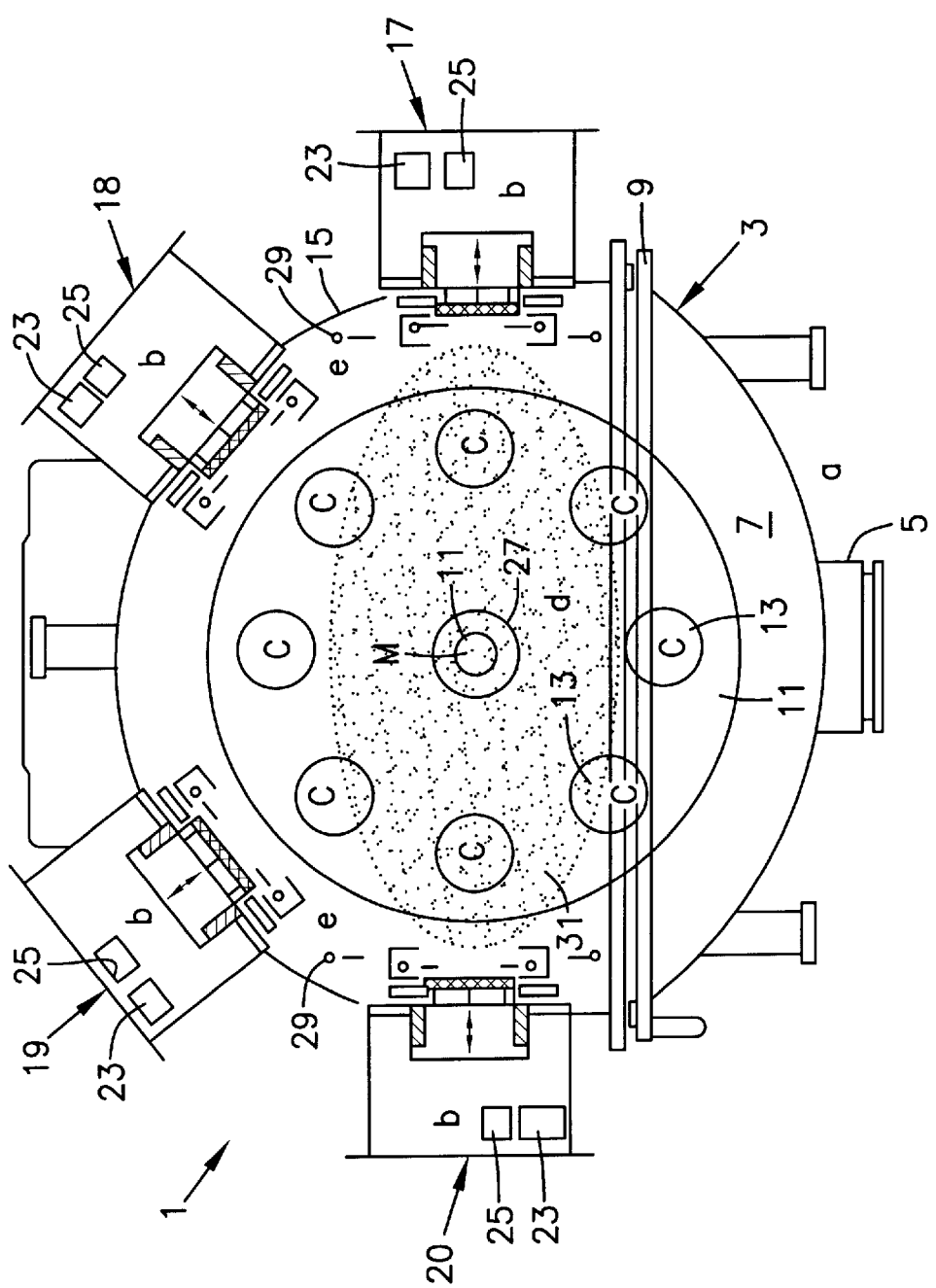
FIG. 1 shows a schematic depiction of a sputtering facility.

FIG. 1 depicts a magnetron sputtering facility 1 which is used to coat substrates. The basic configuration of a magnetron sputtering facility of this kind is known, and detailed description of the individual components will therefore be dispensed with hereinafter.

The magnetron sputtering facility comprises a vessel 3 connected to ground potential, having an extension tube 5 that is connected to a vacuum pump (not depicted). Vessel 3 encloses a process chamber 7 which can be evacuated by way of the vacuum pump. Vessel 3 has an opening mechanism 9 (depicted only schematically), which allows the vessel to be opened and thus the process chamber to be loaded with the substrates for coating.

Provided inside process chamber 7 is a rotation apparatus 11 which receives a number of substrates 13 (eight, in the present exemplary embodiment) and allows the substrates to be rotated about a rotation axis which runs perpendicular to the plane of the drawing.

Sputtering electrode units 17 through 20 are arranged, spaced apart from one another, in a circular (in plan view) wall 15 of vessel 3. All the sputtering electrode units 17 through 20 (four of them in the present exemplary embodiment) are of identical configuration, and they each comprise an electrode and a magnet system. In addition, the electrodes of each sputtering electrode unit 17 through 20 are equipped with a power supply 23 which in turn is connected to a control device 25. For the sake of clarity, both power supply 23 and control device 25 are depicted merely schematically. It is of course also conceivable to provide a common power supply 23 and a common control device 25 for the four (in the present exemplary embodiment) sputtering electrode units 17 through 20.

Sputtering electrode units 17 through 20 are oriented toward a center point M of vessel 3, the aforesaid rotation axis of rotation apparatus 11 running through that center point. The angle enclosed between sputtering electrode units 17, 18 and 18, 19 and 19, 20 is approximately 60°. The angle formed between sputtering electrode units 17, 20 is thus 180°. Other angle combinations are, of course, also conceivable.

In the present exemplary embodiment, the spacing between sputtering electrode units 17 and 20 located opposite one another is approximately 60 cm, which also corresponds approximately to the diameter of the vessel. The spacing between the sputtering electrode units can, however, be varied over a wide range, so that spacings of from 1 m to 2 m are also certainly possible.

Magnetron sputtering facility 1 additionally has a microwave generator 27 that is depicted in purely schematic fashion in FIG. 1. The microwaves of the microwave generator are preferably coupled into process chamber 7 in the region of center point M of vessel 3. In another embodiment, microwaves are coupled in from the edge of the reactor. It is also conceivable to additionally use other plasma sources or particle sources.

Magnetron sputtering facility 1 furthermore has a gas delivery system 29 which is also depicted in purely schematic fashion and has the function of filling process chamber 7 with a process gas. This process gas contains the material to be deposited onto the substrates; the electrodes of sputtering electrode units 17 through 20, preferably made from stainless steel or from a different metal or from a metal compound such as Ti, Cr, W, or Wc, are not atomized or almost not atomized when the facility is in operation.

Sputtering facility 1 operates as follows:

As soon as substrates 13 have been introduced into process chamber 7, the latter is evacuated.

It may be advantageous to heat the process chamber and the substrates located therein to a desired process temperature. This can also result in desorption of the surfaces and a reduction in pumping time.

The substrate surfaces can be cleaned by bombardment with sufficiently energetic ions. This can be accomplished in various ways which are familiar to those skilled in the art and described in the literature.

To enhance adhesion between the substrate and coating, it may be advantageous first to apply an adhesion-promoting intermediate film. The nature of this intermediate layer depends on the substrate and the principal film. It can be applied using both PVD and CVD processes. This can be accomplished either by the use of the electrodes depicted in the drawings, or by way of additional sources (not depicted). The adhesion-promoting film can be deposited with a constant or a variable composition, and can in turn be composed of individual films.

For deposition of the actual principal film, the process gases acetylene and argon are then introduced through gas delivery system 29, a pressure of from $1 \times 10^{-3}$ mbar to $5 \times 10^{-3}$ mbar, in particular approximately $3 \times 10^{-3}$ mbar, being desirable. The ratio between the two gases (argon/acetylene) is 1 to 0.1.

At the beginning of the coating process, for example when operating with two electrodes, the two sputtering electrode units 17 and 20 located opposite one another are activated. For this purpose, the electrodes of the two sputtering electrode units 17, 20 are acted upon by a bipolar, square-wave, pulsed voltage, the pulse frequency preferably lying in the range from 1 kHz to 1 MHz. The time intervals in which the electrodes are acted upon by a positive and by a negative voltage are preferably of equal length. This therefore results in a duty cycle of 1:1 for the square-wave pulsed voltage.

As a result of the bipolar voltage, the electrodes of the two sputtering electrode units 17, 20 operate as both cathodes and anodes. By way of control devices 25, power supplies 23 of the two sputtering electrode units 17, 20 are synchronized with one another so that only of the two electrodes is operating as the cathode at any one time.

The voltage level is set so as to result in a time-averaged electrode output of 4 kW. This means that an output of 8 kW is to be provided for each pulse.

The two sputtering electrode units 17, 20 convert the inflowing process gas into a plasma 31, which is depicted in purely schematic fashion as a plasma cloud extending between the two sputtering electrodes 17, 20.

When a high flow rate of a carbon-containing process gas is admitted into process chamber 7, for example while the electrodes are being supplied with power, there forms on the electrodes, when the flow rate is adjusted accordingly, a film which covers them completely. This is referred to as complete poisoning of the electrodes. Although the electrodes are now insulated, continued operation is still ensured by the use of a pulsed voltage. Poisoning of the electrodes occurs, for example, at acetylene/argon gas ratios greater than 3.

The bipolar voltage input and the corresponding synchronization of the two bipolar voltages ensures that the plasma is extinguished at the end of one plasma pulse while it is reignited at the other opposite electrode. Ignition of the plasma at the electrode that is becoming active is facilitated by the fact that charge carriers from the expiring plasma of the opposite electrode are present.

In order to achieve an optimum coating rate, the parameters of the facility are selected so that the highly spatially stable and isolated plasmas in front of the respective electrodes are not continually created and extinguished, but rather that the plasma is pulled from the cathode that has just been deactivated to the cathode that is going into operation. This requires that the pulse frequency, the ion transit time in the plasma, and the electrode spacings be matched to one another. In this case the plasma, which does not extinguish, migrates back and forth between the opposing electrodes at the selected pulse frequency. Substrates 13 located in the path of the plasma thus also experience, in addition to the directed coating by the electrodes, an additional coating from the moving plasma volume.

In order to increase the coating rate further, microwave generator 27 can be used to couple microwaves into process chamber 7 to ensure additional excitation of the process gas. This excitation causes not only direct coating of the substrates but also coating of the electrodes. An additional magnetic field makes it possible to utilize the ECR effect, increase the plasma density, and operate the plasma at lower pressures.

It is particularly advantageous to operate control units 25 separately from one another, so that the power supplies and thus the respective electrode outputs can be adjusted independently of one another. This makes it possible, for example, to compensate for different degrees of electrode erosion. It is thereby also possible to influence the composition of the films deposited by the individual electrodes. It is possible in this fashion to build up multiple layers of alternating individual films.

The method is used principally for coating surfaces in order to enhance their ability to resist wear. For example, amorphous hydrogen-containing carbon films containing little or no metal are deposited. In this context, with bipolarly pulsed sputtering electrodes, the flow rate of a carbon-containing carbon gas is elevated so as to result in complete coverage of the electrodes with carbon. The coating rate is greatly elevated as compared to an only partially covered electrode, while the proportion of metal incorporated into the film is reduced, and may decrease to zero.

The method described makes possible film deposition at high rates. Conversely, it is also possible to select a coating rate lower than the maximum possible one, and thus to lower the coating temperature.

Figure 2:
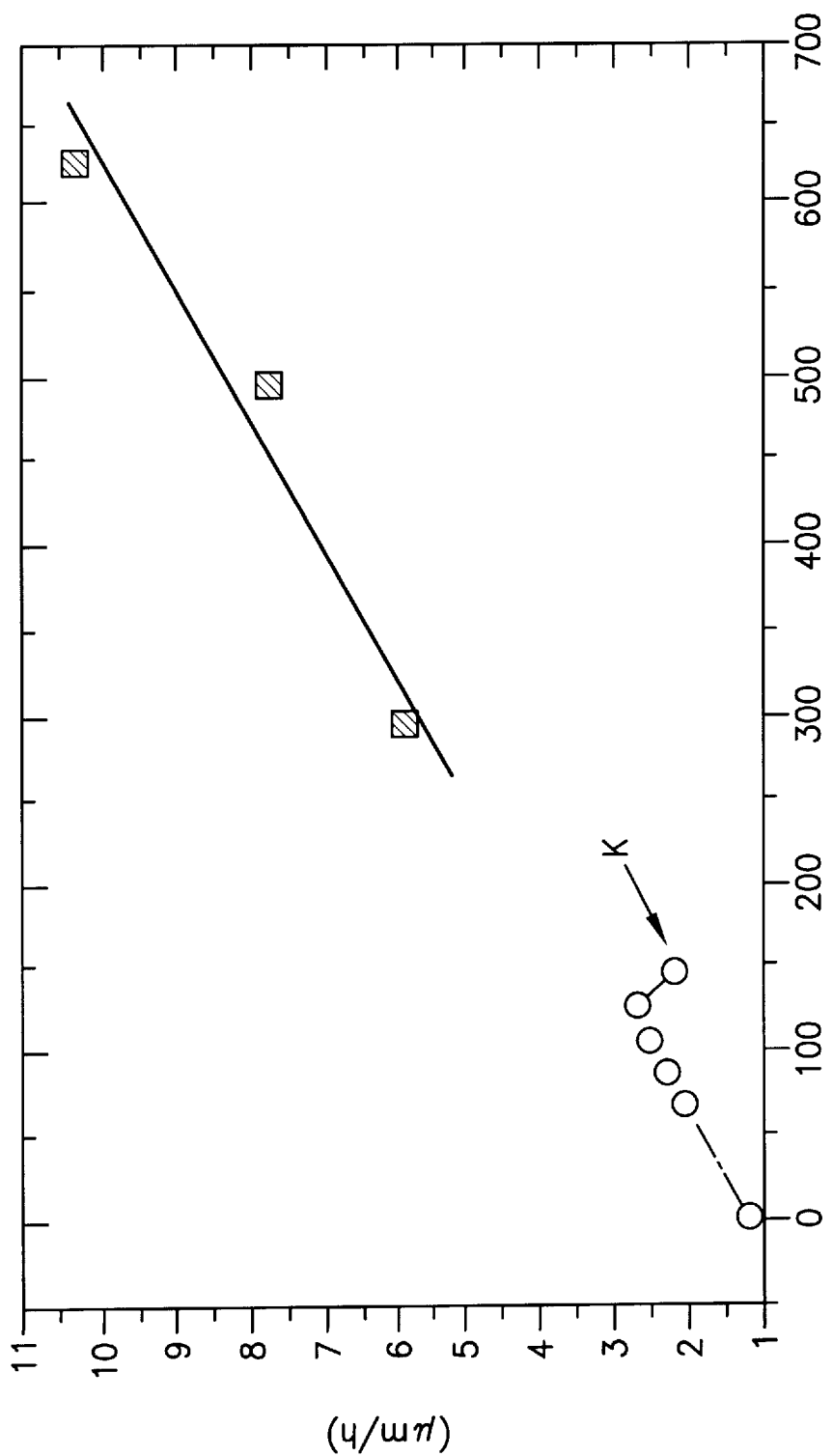
FIG. 2 shows a diagram in which the deposition rate (in $\mu$m/hour) is indicated as a function of gas flow rate, for various processes (DC sputtering and sputtering according to the present invention).

To illustrate the coating rates, FIG. 2 shows a diagram in which gas flow rate is plotted on the X axis, and deposition rate (in $\mu$m/hour) on the Y axis. It is evident that the deposition rates of known methods (DC sputtering, plotted as o) fall in the range from 0 to 4, while the measured deposition rates with the method according to the present invention (plotted as solid squares) were in the range from 4 to 12. Operation of the conventional method at higher gas flow rates is not practically possible, since operating stability is then lost. In FIG. 2, K denotes the point for the conventional method at which poisoning of the electrodes occurs, with the result that the deposition rate declines.

A further example concerns the use of more than two electrodes and other configurations. A wide variety of arrangements is, in principle, conceivable. For an even-numbered arrangement, for example, it is possible to use four electrodes, of which those directly adjacent have an angle of 90° with respect to one another, or perhaps six with a 60° angle, etc. These electrodes can be pulsed in pairs or in groups with respect to one another.

What is claimed is:

1. A method for coating a surface of a substrate using a system, the system including at least two electrodes, a process chamber defining a chamber volume, and an inlet arrangement, the inlet arrangement being utilized to provide a first process gas into the process chamber, the at least two electrodes being situated inside of the process chamber and being spaced from one another at a distance, the method comprising the steps of:

positioning the surface of the substrate between the at least two electrodes;

applying a bipolarly pulsed voltage to the at least two electrodes so that the at least two electrodes are alternately operated as cathodes and anodes to provide a plasma source and a particle source;

setting a frequency of the bipolarly pulsed voltage between 1 kHz and 1 MHZ; and during an operating state, at least partially covering the at least two electrodes by a coating material using operating parameters.

2. The method according to claim 1, further comprising the step of:

providing a reactive gas to effect a poisoning of surfaces of the at least two electrodes.

3. The method according to claim 2, further comprising the step of:

increasing a flow rate value of the reactive gas above a value to completely cover the surfaces of the at least two electrodes.

4. The method according to claim 1, further comprising the step of:

filling the chamber volume between the at least two electrodes with a plasma.

5. The method according to claim 1, further comprising the step of:

filling a portion of the process chamber with a plasma, substrate being situated in the portion.

6. The method according to claim 1, further comprising the step of:

filling the chamber volume between the at least two electrodes with a plasma using a varying pulse frequency.

7. The method according to claim 1, wherein the bipolarly pulsed voltage includes a substantially square-wave voltage.

8. The method according to claim 1, further comprising the step of:

adjusting a duty cycle of the bipolarly pulsed voltage.

9. The method according to claim 1, further comprising the step of:

adjusting a duty cycle of the bipolarly pulsed voltage to a value of approximately 1:1.

10. The method according to claim 1, wherein the distance is up to 2 m.

11. The method according to claim 1, wherein the distance is between 60 cm and 1 m.

12. The method according to claim 1, wherein the first process gas includes an inert gas and a reactive gas.

13. The method according to claim 12, wherein the inert gas includes one of Ar, Kr and He.

14. The method according to claim 12, wherein, when the method is utilized to produce a carbon-containing film, the reactive gas includes one of methane and acetylene.

15. The method according to claim 12, wherein, when the method is utilized to produce a silicon-containing film, the reactive gas includes silanes.

16. The method according to claim 12, wherein the reactive gas includes one of silane, silicon organics and organometallics.

17. The method according to claim 16, wherein the silicon organics includes one of hexamethyldisilane, hexamethyldisiloxane, hexamethyldisilazane and tetramethylsilane.

18. The method according to claim 1, further comprising the step of: providing a second process gas to the process chamber.

19. The method according to claim 18, wherein the second process gas includes one of $N_2$, $H_2$ and $O_2$.

20. The method according to claim 1, further comprising the step of:

providing the first process gas into the process chamber via at one least one inlet point of the inlet arrangement, the first process gas including at least one mixture of gases.

21. The method according to claim 20, further comprising the step of:

setting a pressure inside of the process chamber between $1 \times 10^{-3}$ mbar and $5 \times 10^{-3}$ mbar.

22. The method according to claim 21, further comprising the step of:

selecting a ratio of a first gas flow rate of the inert gas and a second gas flow rate of the reactive gas.

23. The method according to claim 22, wherein the ratio ranges between 1 and 0.1.

24. The method according to claim 1, further comprising the step of:

utilizing methane silane as the first process gas.

25. The method according to claim 1, further comprising the step of:

coupling microwave radiation into the process chamber.

26. The method according to claim 1, further comprising the step of:

adjusting a corresponding output of each of the at least two electrodes separately.

27. The method according to claim 26, wherein the adjusting step is performed in a controlled manner.

28. The method according to claim 1, further comprising the step of:

performing a coating procedure at a temperature which is less than or equal to 200° C.

29. The method according to claim 1, wherein the at least two electrodes are arranged in a manner so that the at least two electrodes enclose an angle between 0° and 180°.

30. The method according to claim 29, wherein the angle is one of 60°, 90° and 180°.

31. The method according to claim 1, wherein the at least two electrodes include magnetron sputtering cathodes.

32. The method according to claim 31, wherein the magnetron sputtering cathodes have one of a planar configuration, a cylindrical configuration and a curved configuration.

33. The method according to claim 1, wherein the at least two electrodes include one of medium-frequency electrodes, high-frequency electrodes, ECR electrodes and hollow cathodes.

34. The method according to claim 1, wherein the process chamber is connected to a ground potential.

35. The method according to claim 1, further comprising the step of:

depositing a carbon-containing film.

36. The method according to claim 35, wherein the carbon-containing film includes an amorphous hydrogen-containing carbon film having a metal content.

37. The method according to claim 1, further comprising the step of:

depositing a silicon-containing film.

38. The method according to claim 37, wherein the silicon-containing film includes an amorphous hydrogen-containing silicon layer having a metal content.

39. The method according to claim 1, further comprising the step of:

connecting parts to be coated to a negative bias potential.

40. The method according to claim 39, wherein the negative bias potential is pulsed.

41. The method according to claim 40, wherein the negative bias potential is an HF bias.

42. The method according to claim 1, further comprising the step of:

performing a coating procedure on one of a stationary substrate and a moving substrate.

43. The method according to claim 1, further comprising the step of:

utilizing further plasma sources and further particle sources.

44. The method according to claim 43, wherein the further plasma sources and the further particle sources include one of a microwave, an ECR microwave, a hollow-cathode and arc sources.

45. The method according to claim 43, wherein the further plasma sources and the further particle sources include evaporators.

46. The method according to claim 1, wherein the system includes one of a batch system, a continuous-flow system and a bulk material system.

* * * * *